United States Patent
Lee

(10) Patent No.: US 9,159,454 B2
(45) Date of Patent: Oct. 13, 2015

(54) FAILURE DETECTION APPARATUS FOR SOLID STATE DRIVE TESTER

(71) Applicant: UNITEST INC, Yongin-si, Gyeonggi-do (KR)

(72) Inventor: Eui Won Lee, Seongnam-si (KR)

(73) Assignee: UNITEST INC, Yongin-si, Gyeonggi-do (KR)

( * ) Notice: Subject to any disclaimer, the term of this patent is extended or adjusted under 35 U.S.C. 154(b) by 139 days.

(21) Appl. No.: 13/921,918

(22) Filed: Jun. 19, 2013

(65) Prior Publication Data

US 2014/0047289 A1 Feb. 13, 2014

(30) Foreign Application Priority Data

Aug. 13, 2012 (KR) ................ 10-2012-0088326

(51) Int. Cl.
*G11C 29/00* (2006.01)
*G11C 29/10* (2006.01)
*G06F 11/22* (2006.01)

(52) U.S. Cl.
CPC ............ *G11C 29/10* (2013.01); *G06F 11/2221* (2013.01)

(58) Field of Classification Search
CPC ...... G11C 29/10; G06F 11/2221; G06F 13/14
See application file for complete search history.

(56) References Cited

U.S. PATENT DOCUMENTS 7,873,885 B1* 1/2011 Shin et al. ............... 714/724
2012/0191402 A1* 7/2012 Filler et al. .............. 702/119

FOREIGN PATENT DOCUMENTS

KR 10-2008-0039605 A 5/2008
KR 10-2010-0114697 A 10/2010

* cited by examiner

*Primary Examiner* — Sam Rizk
(74) *Attorney, Agent, or Firm* — Novick, Kim & Lee, PLLC; Jae Youn Kim

(57) ABSTRACT

A failure detection apparatus for a solid state driver tester is provided. The failure detection apparatus includes a host terminal for receiving a test condition for testing a storage from a user and a test control unit for creating a test pattern according to the test condition or creating a test pattern at random, and adaptively selects an interface according to a type of the storage to be tested to test the storage with the test pattern. The test control unit includes a plurality of buffer memories for storing readout data of the storage, stores the readout data in the buffer memories in an interleaving manner, and endows comparison of the created test pattern and the readout data stored in the buffer memories with continuity to test the storage in real time.

8 Claims, 6 Drawing Sheets

FAILURE DETECTION APPARATUS FOR SOLID STATE DRIVE TESTER

BACKGROUND OF THE INVENTION

1. Field of the Invention

The present invention a failure detection apparatus for a solid state drive tester, and more particularly to a failure detection apparatus for a solid state drive tester which controls a plurality of memories in an interleaving manner when a storage is tested, thereby endowing a comparison operation for detecting a failure with a continuity and performing a comparison function in real time without lowering speed.

2. Description of the Related Art

Until now, hard disk drives (HDDs) have been most generally known and used as large capacity digital media storage devices. However, In recent years, as prices of NAND flash semiconductor devices, which can store the largest capacity among semiconductor devices having a memory function and data stored therein are not erased even when electric power is not supplied, are being lowered, large capacity digital media storage apparatus such as solid state drives (SSDs) using a semiconductor having a memory function are newly appearing.

Writing and reading speeds of such an SSD are 3 to 5 times as fast as those of existing hard disks, and its performance of reading/writing an random address required by a database management system is several hundreds of times as excellent as those of existing hard disks. In addition, an SSD is operated in a silent way, so a noise problem of an existing hard disk can be solved. Further, since the SSD is operated with power consumption significantly lower than that of a hard disk, the SSD is known as to most suitable for a digital device, such as a laptop computer, which requires low power consumption.

In addition, the SSD has a higher durability against an external impact than an existing hard disk, and as the SSD can be manufactured to be smaller and more various in shape as compared with a hard disk having a fixed form in terms of an external design, an external shape of an electronic product employing the SSD can be made smaller, showing many excellent advantages in its applications.

Due to its advantages, it is expected that distributions of SSDs can be expanded rapidly to searches, home shopping, storage media of video service servers, storage media for storing various R&D materials, and special equipment, as well as existing desktop computers or laptop computers.

In order to test the SSD, an SSD tester according to the related art is disclosed in FIG. 1. An SSD tester according to the related art shown in FIG. 1 includes a host terminal 110, a network 120, a test control unit 130, a memory 140. In FIG. 1, reference numeral 200 denotes a storage unit 200 including a plurality of storages 201 to 200+N which are test targets.

The host terminal 110 functions to receive a test condition for testing a storage from a user, and the network 120 is in charge of a data interface between the host terminal 110 and the test control unit 130.

The memory 140 has a program embedded therein to test the SSD, and acts as a data storage device to store pattern data used for generating test patterns and data which are generated when testing the SSD. The test control unit 130 tests a storage using a test pattern by adaptively selecting an interface according an interface type of the storage after generating the test pattern according to test conditions or randomly. In this case, preferably, a plurality of devices provided in the test control unit 130 to test the SSD are implemented in the form of one chip by using a field programmable gate array (FPGA).

More preferably, the test control unit 130 is divided into a control unit, which controls the test of the storage, and a test executing unit, which actually performs a test function, in hardware, so that a plurality of storages can be tested in real time.

The test control unit 130 includes a communication interface unit 131 connected to the host terminal 110 through the network 120 to receive user information and to transmit the test result to the host terminal 110, a storage interface unit 132 for interfacing the storage unit 200, and an embedded processor 133 for controlling storage test, and a test executing unit 160 which is connected to the embedded processor 133, generates test patterns for storage test to transmit the test patterns to a storage, and reads the test patterns out of the storage and compares the test patterns of the storage with the generated test patterns to determine the failure state of the storage test.

In addition, as illustrated in FIG. 2, the test executing unit 160 includes a pattern data generator 161, which generates pattern data by selecting one of pattern data generated under the test conditions and randomly-generated pattern data according to a pattern data select signal output from the embedded processor 133, a buffer memory 162, which temporarily stores data read out of the storage, a failure processor 163, which compares the pattern data generated from the pattern data generator 161 with the readout data temporarily stored in the buffer memory 162 to determine a failure, and generates failure information in case of a failure, a failure memory 164, which stores the failure information generated from the failure processor 163, and an instruction generator 165 which transmits a test instruction generated from the embedded processor 133 to the storage interface unit 132.

Meanwhile, the storage interface unit 132 includes a plurality of multi-interfaces 151 to 151+N. Here, internal configurations and operations of the plurality of multi-interfaces 151 to 151+N are the same, and thus only one multi-interface 151 will be described below for convenience' sake.

In the state that the test devices of the SDD having the above structure are provided in the form of one chip on one board through the FPGA, a user connects the SSD tester to a storage to be tested, inputs test condition through the host terminal 110 through the host terminal 110 in order to test the SSD. The test condition may include an interface select signal for the interface with the storage to be tested, and a test pattern select signal. The test pattern select signal is used to determine if preset pattern data are selected or if randomly-generated pattern data are selected.

The test condition of the user input through the host terminal 110 is transferred to the one-chipped test control unit 130 through the network 120.

The communication interface unit 131 of the test control unit 130 receives the test condition input by the user through the network 120, and transfers the received test condition to the embedded processor 133. If the test condition is input by the user and a test is requested, the embedded processor 133 extracts a test program for the storage test from the memory 140 and starts to test the storage. Here, as an initial operation of the test, test pattern data corresponding to the test condition input by the user are extracted from the memory 140 and transmits the test pattern to the test executing unit 160.

The test executing unit 160 is prepared by realizing a module for actually performing a test in the form of a logic separated from the embedded processor 133. As described above, the load of the embedded processor 133 can be reduced by separating the module for performing the test (generating test pattern data and determining failure) from the embedded processor 133. Accordingly, a plurality of storages can be simultaneously controlled and tested, so that the whole test time can be reduced.

In more detail, as shown in FIG. 2, the pattern data generator 161 of the test executing unit 160 generates pattern data by selecting one of pattern data generated corresponding to the test conditions and randomly-generated pattern data according to the pattern data select signal output from the embedded processor 133.

The pattern data are transmitted to the multi-interface 151 of the storage interface unit 132. The multi-interface 151 selects an interface corresponding to the storage 201 according to the interface select signal output from the embedded processor 133, transforms the pattern data in the form suitable for the selected interface, and transmits the pattern data and the test instruction to the storage 201.

Thereafter, after passing through the instruction generator 165, instruction data output from the embedded processor 133 for the test are transmitted to the storage 201 through the multi-interface 151, and though the instruction data and writing data, the storage test is started.

Next, after result data for testing the storage 201 are read out according to a reading instruction, they are transferred to the test executing unit 160 after sequentially passing through the multi-interface 151 and the embedded processor 133.

The buffer memory 162 of the test executing unit 160 temporarily stores the readout data. If the read data have been completely stored, the failure processor 163 compares expected data (pattern data) output from the pattern data generator 161 with the read data received from the embedded processor 133 according to channels by using a comparator embedded therein. If the expected data are the same as the read data, the failure processor 163 does not output the result. If the expected data differ from the read data, the failure processor 163 generates a failure signal.

An internal failure counter increases an internal failure count value by 1 based on the failure signal and outputs the failure count value, and an internal failure memory address generator generates a failure memory address to be transmitted to the failure memory 164.

The failure memory 164 stores the expectation data and the readout data input to the failure processor 163 as failure information while taking the transferred address as a logical block address (LBA).

The failure of the storage test is not processed in the embedded processor 133, but processed in the test executing unit 160 realized in the form of a logic separated from the embedded processor 133. If necessary, a plurality of pattern data can be simultaneously generated and the failure states of a plurality of storages can be simultaneously determined. Accordingly, the load of the embedded processor 133 can be reduced, and since the storages are simultaneously tested, the storage test time can be reduced.

In addition, the failure information stored in the failure memory 164 is transferred to the embedded processor 133 according to a request of the embedded processor 133, and is transmitted to the host terminal 110 through the communication interface unit 131 and the network 120.

Thus, the user can recognize the test result of the storage easily tested through the host terminal 110.

However since one buffer memory is provided according to the related art, when data input to a multi-interface are stored in the buffer memory, readout data input in real time cannot be compared with expectation data generated in a pattern generator.

For example, according to the related art, while readout data are stored in the buffer memory, a failure processor cannot determine a pass or a failure, a pass or failure can be determined by the failure processor only after all readout data are recorded in a buffer memory. Thus, since data can be read out from a storage only after an operation of reading out data from a storage is stopped while the failure processor determines a pass or failure and a pass or failure is completely determined, it is impossible to determine data of the storage in the failure processor in real time and accordingly, a time for determining a pass or failure is increased due to this.

SUMMARY OF THE INVENTION

Accordingly, the present invention has been made keeping in mind the above problems occurring in the prior art, and an object of the present invention is to provide a failure detection apparatus for a solid state drive tester which controls a plurality of memories in an interleaving manner when a storage is tested, thereby endowing a comparison operation for detecting a failure with a continuity.

Another object of the present invention is to provide a failure detection apparatus for a solid state drive tester which controls a plurality of memories in an interleaving manner when a storage is tested, thereby endowing a comparison operation for detecting a failure with a continuity and performing a comparison function in real time without lowering speed.

According to an aspect of the present invention, there is provided a failure detection apparatus for a solid state driver tester, the failure detection apparatus including: a host terminal for receiving a test condition for testing a storage from a user; and a test control unit for creating a test pattern according to the test condition or creating a test pattern at random, and adaptively selecting an interface according to a type of the storage to be tested to test the storage with the test pattern, wherein the test control unit includes a plurality of buffer memories for storing readout data of the storage, stores the readout data in the buffer memories in an interleaving manner, and endows comparison of the created test pattern and the readout data stored in the buffer memories with continuity to test the storage in real time.

The test control unit may include: an embedded processor for controlling a test of the storage; and a test executing unit for creating a test pattern for a test of the storage in association with the embedded processor to transmit the test pattern to the storage, and reading out the test pattern stored in the storage to compare the readout test pattern with the created test pattern in real time to process a failure.

The test control unit may further include: a communication interface unit connected to the host terminal through a network to receive information of a user and transmit a test result to the host terminal; and a storage interface unit for interfacing the storage.

The test executing unit may include: a pattern data generator selecting one of the pattern data created to correspond to the test condition or the pattern data created at random according to a pattern data selection signal output from the embedded processor to generate pattern data; an inverter for inverting a phase of a memory selection signal for storing the readout data read out from the storage in an interleaving manner; a first buffer memory for storing the readout data read out from the storage according to the phase inverted memory selection signal output by the inverter; a second buffer memory for storing the readout data read out from the storage according to the memory selection signal; a multiplexer for selecting one of the readout data output from the first and second buffer memories according to the memory selection signal to output the selected readout data; a failure processor for comparing the pattern data generated by the pattern data generator and the readout data output from the multiplexer to determine a failure, generating failure information in case of a failure, and generating the memory selection signal; a failure memory for storing the failure information generated by the failure processor; and an instruction generator for transmitting a test instruction generated by the embedded processor to a storage interface unit.

The pattern data generator may include: a pattern data memory for storing the pattern data created according to the test condition; a pattern data creating unit for creating pattern data at random to output the created pattern data as random pattern data; and a multiplexer for selecting one of the pattern data output from the pattern data memory and the random pattern data output from the pattern data creating unit according to a pattern data selection signal output from the embedded processor to output the selected pattern data as pattern data.

The pattern data creating unit may include a plurality of pattern data creators for creating pattern data at random.

The failure processor may include: a comparator for comparing writing data generated by the pattern data generator with reading data read out from the storage, and generating a failure signal when the writing data and the readout data are not the same; a failure counter for counting the number of failure signals generated by the comparator, and outputting a failure count value; and a failure memory address generator for generating a storage address for storing a failure signal when the failure signal is generated by the comparator.

The storage interface unit may include a plurality of multi-interfaces for testing a plurality of storages at the same time, and the multi-interface includes a plurality of interfaces to correspond to an interface of the storage, and selects one of the interfaces according to an interface selection signal generated to correspond to the storage interface by the embedded processor to interface with the storage.

Accordingly, the present invention can control a plurality of memories in an interleaving manner when a storage is tested, thereby endowing a comparison operation for detecting a failure with a continuity.

Further, the present invention can control a plurality of memories in an interleaving manner when a storage is tested, thereby endowing a comparison operation for detecting a failure with a continuity and performing a comparison function in real time without lowering speed.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Hereinafter, an exemplary embodiment of the present invention will be described in detail with reference to the accompanying drawings. A detailed description of known functions and configurations of the present invention will be omitted when it may make the subject of the present invention unclear.

Figure 1:
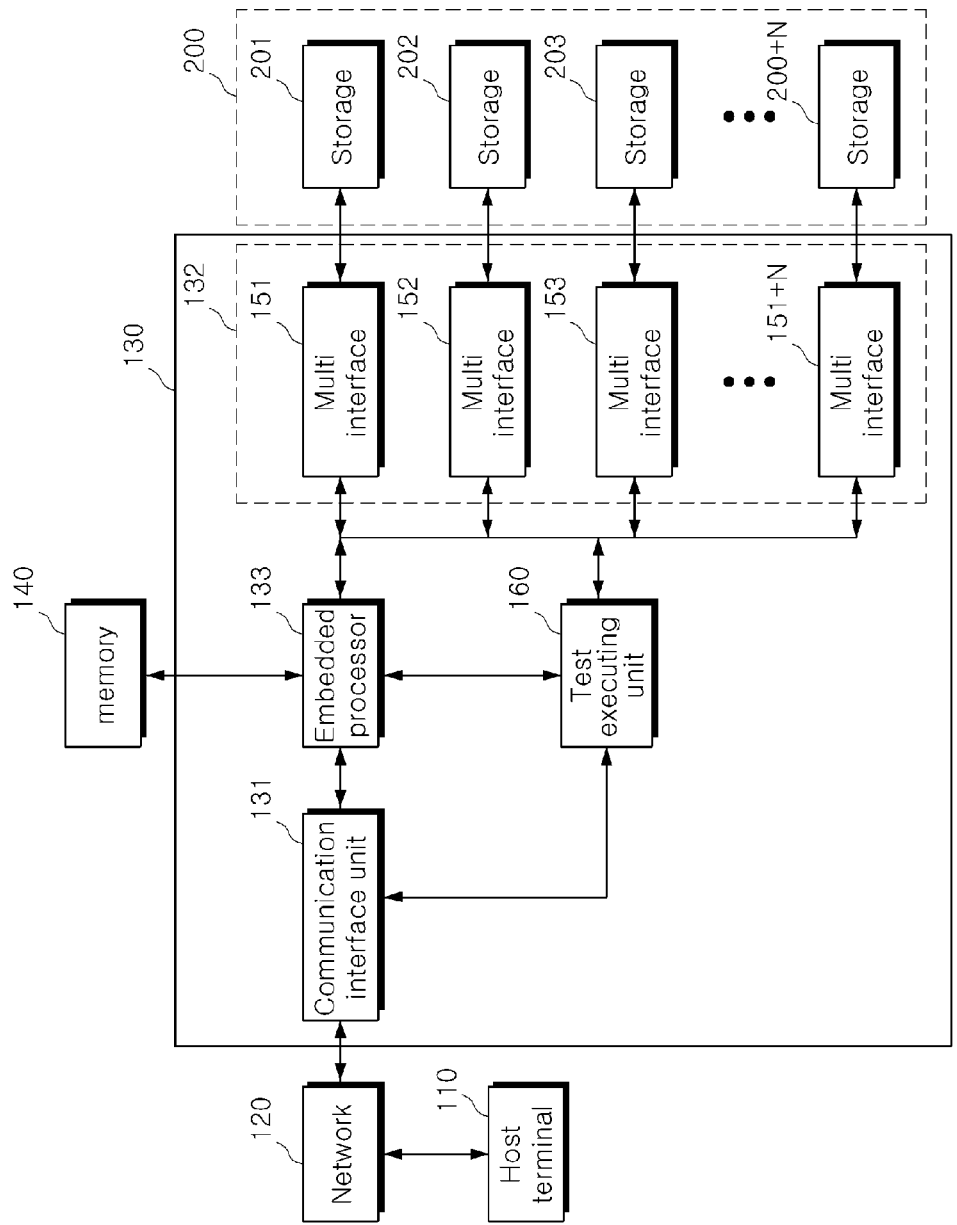
FIG. 1 is a schematic block diagram of a solid state drive test device according to the related art.
Figure 2:
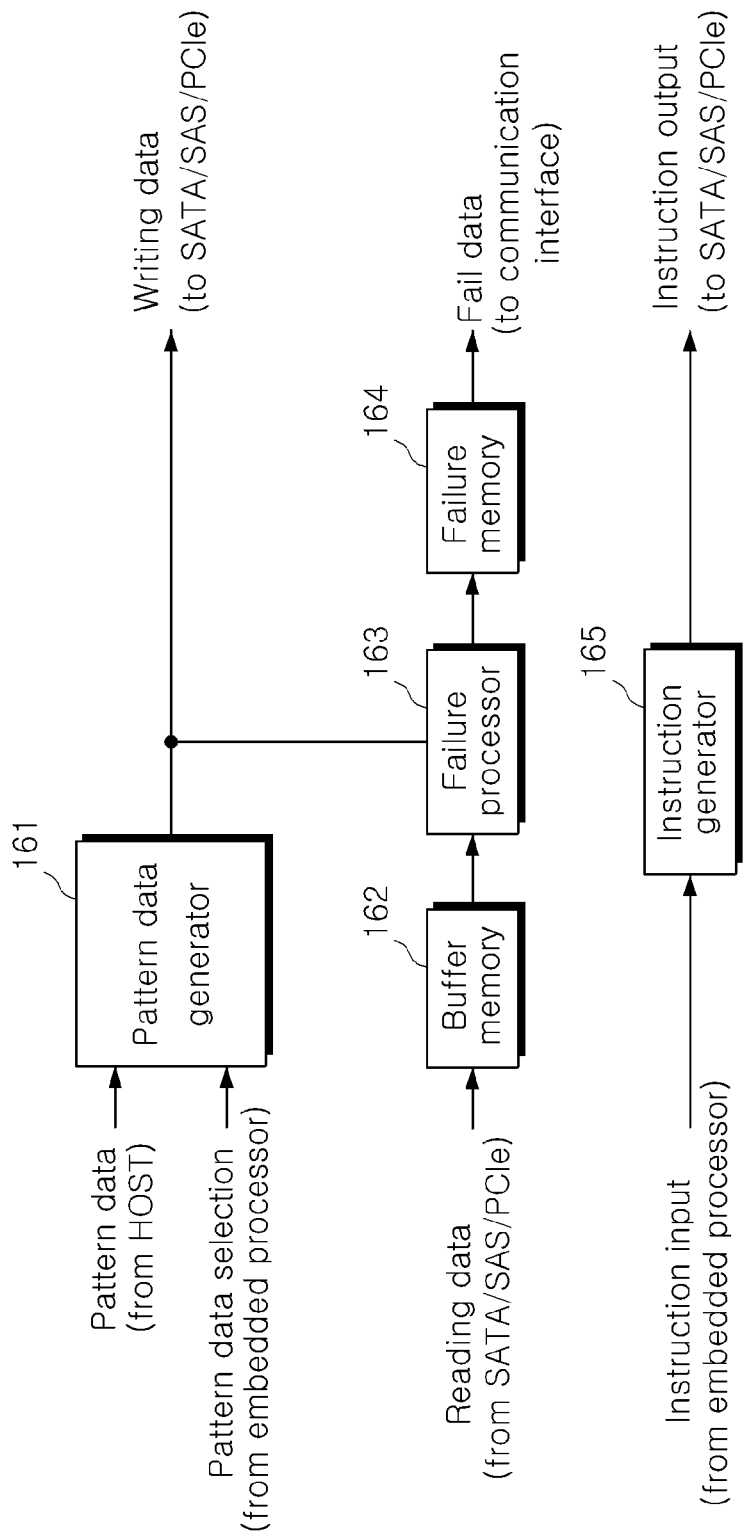
FIG. 2 is a block diagram of an embodiment of a test executing unit of FIG. 1.

As in the solid state drive test device illustrated in FIG. 1, a failure detection apparatus for a solid state drive tester according to the present invention a host terminal 110, a network 120, a test control unit 130, and a memory 140. In FIG. 2, reference numeral 200 denotes a storage unit 200 including a plurality of storages 201 to 200+N which are test targets.

Figure 3:
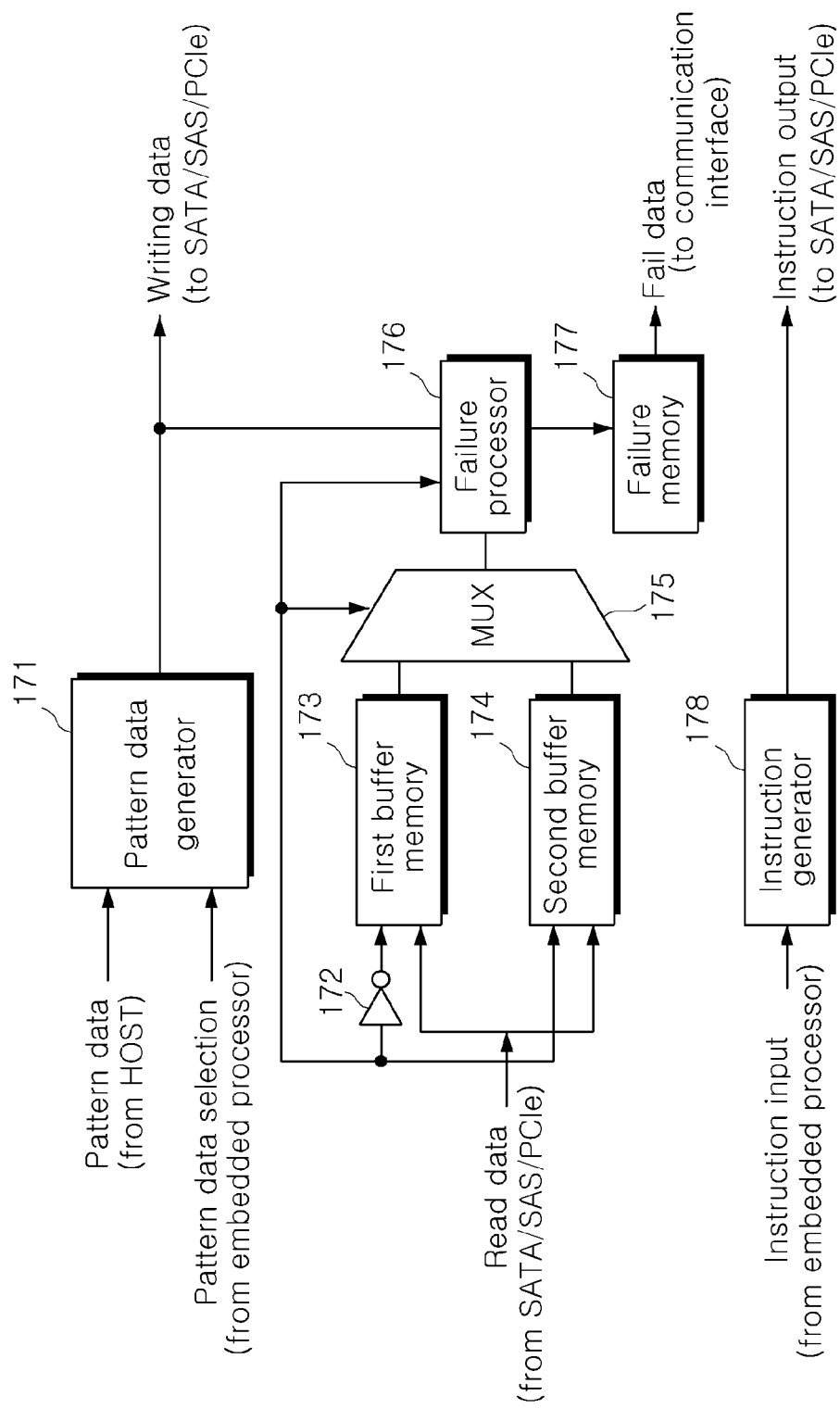
FIG. 3 is a block diagram of an embodiment of a test executing unit according to the present invention.

Here, the feature of the present invention is that, by implementing the test executing unit illustrated in FIG. 1 with a configuration of FIG. 3, readout data of a storage is continuously stored in real time, and a failure processor continuously compares readout data with expectation data in real time. Although not illustrated, it is assumed that reference numeral 160 of FIG. 1 which denotes a test executing unit is changed to reference numeral 170 in the present invention, and FIG. 3 illustrates an embodiment of the test executing unit 170.

The host terminal 110 functions to receive a test condition for testing a storage from the user, and the network 120 is in charge of a data interface between the host terminal 110 and the test control unit 130.

A program for testing an SSD is stored in the memory 140, which functions as a data storage device for storing pattern data for creating a test pattern and data generated during a test of an SSD.

The test control unit 130 functions to create a test pattern according to a test condition or create a test pattern at a random, and adaptively select an interface according to a type of the storage to be tested to test the storage with the test pattern. Here, preferably, a plurality of devices installed in the test control unit 130 to test the SSD is implemented as one chip by using a field programmable gate array (FPGA).

More preferably, the test control unit 130 is separated in a hardware manner into a control part for controlling a test of the storage and a text executing part for actually performing a test to test a plurality of storages in real time. In addition, the test control unit 130 includes a plurality of buffer memories for storing readout data of the storage, stores the readout data in the buffer memories in an interleaving manner, and endows comparison of the created test pattern and the readout data stored in the buffer memories with continuity to test the storage in real time.

The test control unit 130 includes: a communication interface unit 130 connected to the host terminal 110 through a network 120 to receive information of a user and transmit a test result to the host terminal 110, a storage interface unit 132 for interfacing the storage unit 200, an embedded processor 133 for controlling a test of the storage 200, and a test executing unit 170 for creating a test pattern for a test of the storage in association with the embedded processor to transmit the test pattern to the storage, and reading out the test pattern stored in the storage to compare a readout test pattern stored in the storage with the created test pattern in real time to process a failure.

Further, as illustrated in FIG. 3, the test executing unit 170 includes a pattern data generator 171 selecting one of the pattern data created to correspond to the test condition or the pattern data created at random according to a pattern data selection signal output from the embedded processor 133 to generate pattern data, an inverter 172 for inverting a phase of a memory selection signal for storing the readout data read from the storage in an interleaving manner, a first buffer memory 173 for storing the readout data read out from the storage according to the phase inverted memory selection signal output by the inverter 172, a second buffer memory 174 for storing the readout data read out from the storage according to the memory selection signal, a multiplexer 175 for selecting one of the readout data output from the first and second memories 173 and 174 according to the memory selection signal to output the selected readout data, a failure processor 176 for comparing the pattern data generated by the pattern data generator 171 and the readout data output from the multiplexer 175 to determine a failure, generating failure information in a case of a failure, and generating the memory selection signal, a failure memory 177 for storing the failure information generated by the failure processor 176, and an instruction generator 178 for transmitting a test instruction generated by the embedded processor 133 to the storage interface unit 132.

Figure 4:
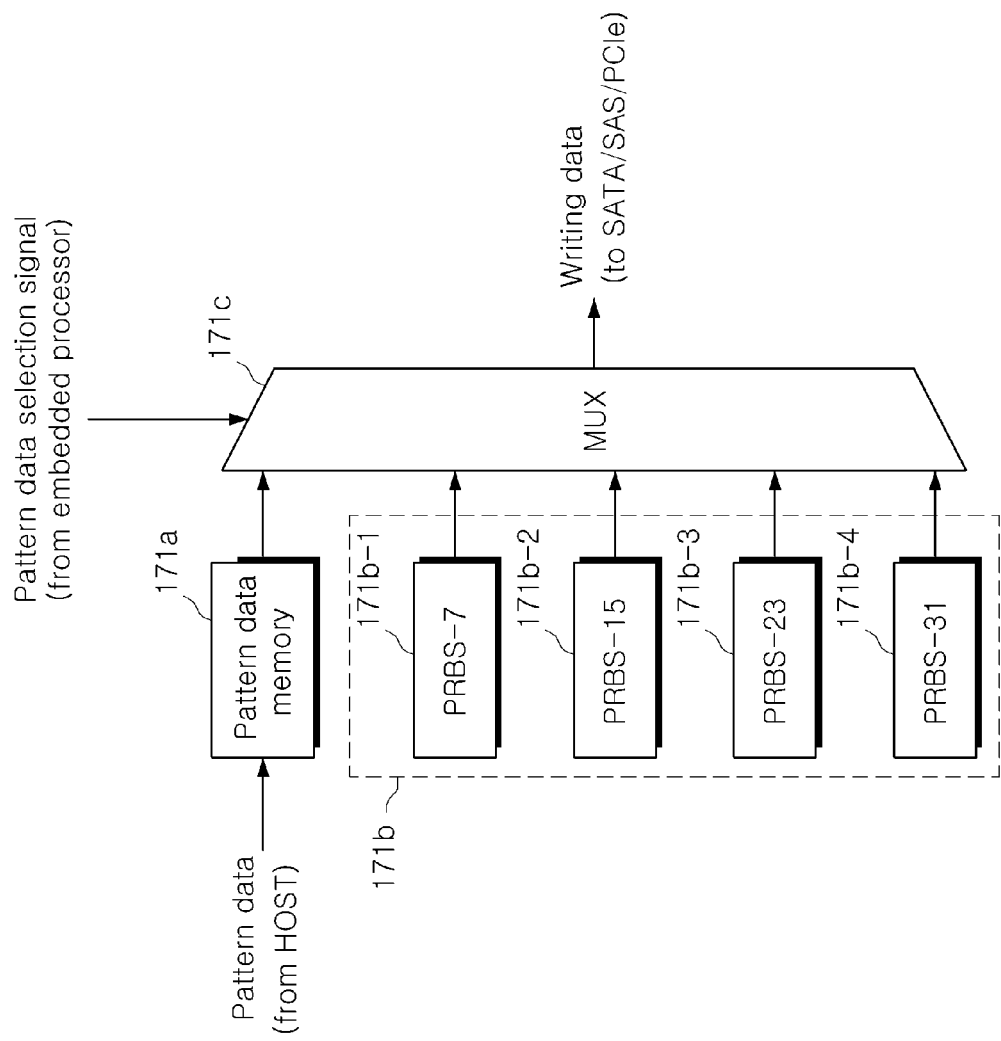
FIG. 4 is a block diagram of an embodiment of a pattern data generator according to the present invention.

In addition, as illustrated in FIG. 4, the pattern data generator 171 includes a pattern data memory 171a for storing pattern data created according to the test condition, a pattern data creating unit 171b for creating pattern data at random to output the pattern data as random pattern data, and a multiplexer 171c selecting one of the pattern data output by the pattern data memory 171a and the random pattern data output by the pattern data creating unit 171b according to a pattern data selection signal output by the embedded processor 133 to output the selected pattern data as pattern data.

Figure 6:
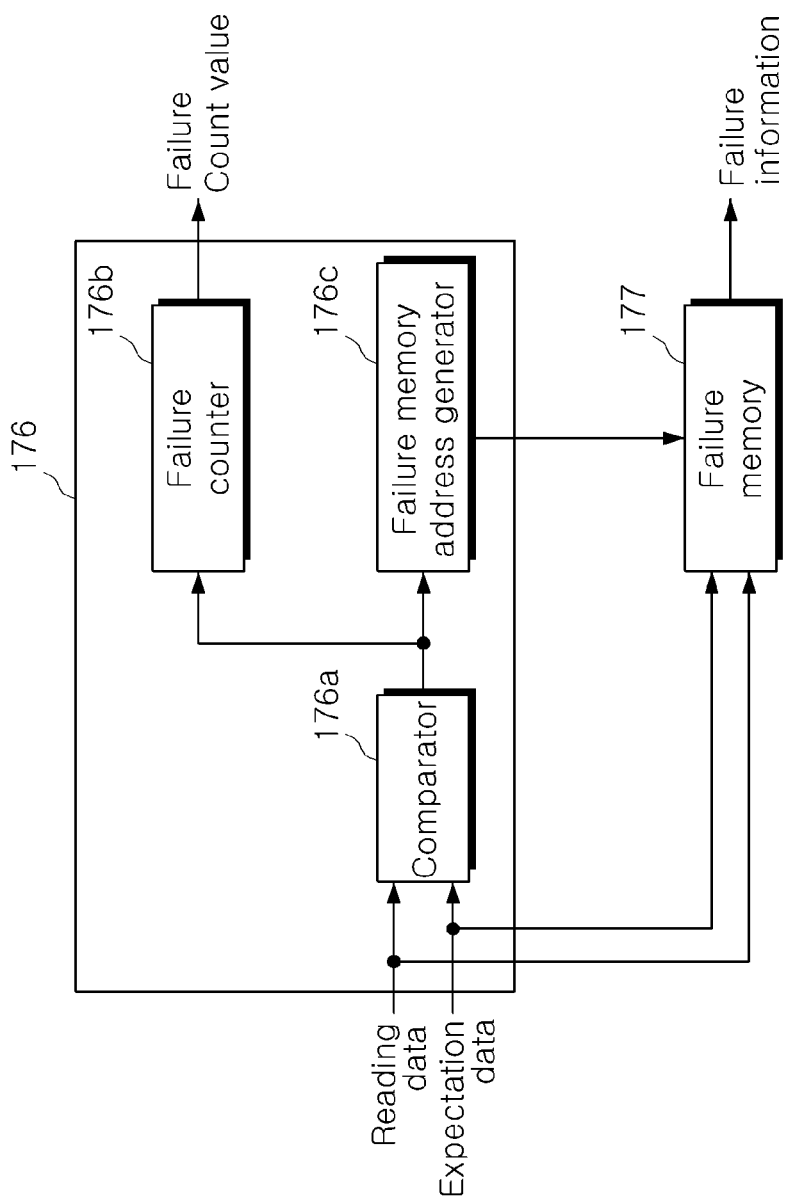
FIG. 6 is a block diagram of an embodiment of a failure processor according to the present invention.

As illustrated in FIG. 6, the failure processor 176 includes a comparator 176a for comparing writing data (expectation data) generated by the pattern data generator 171 with reading data read out from the storage 201, and generating a failure signal when the writing data and the readout data are not the same, a failure counter 176b for counting the number of failure signals generated by the comparator 176a, and outputting a failure count value, and a failure memory address generator 176c for generating a storage address for storing a failure signal when the failure signal is generated by the comparator 176a.

The storage interface unit 132 includes a plurality of multi-interfaces 151 to 151+N for testing a plurality of storages at the same time. Here, the internal configuration and operation of the multi-interfaces 151 to 151+N are the same, only one multi-interface 151 will be described below for convenience' sake.

Figure 5:
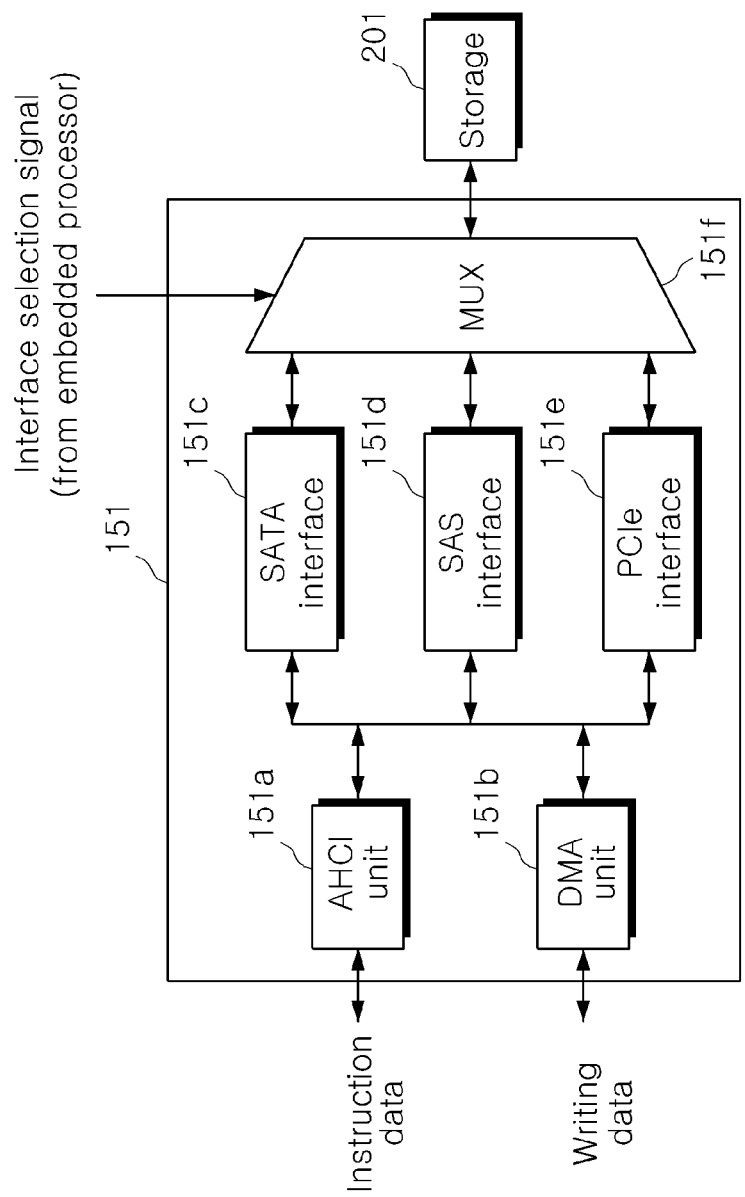
FIG. 5 is a block diagram of an embodiment of a multi-interface according to the present invention.

As illustrated in FIG. 5, the multi-interface 151 includes an advanced host controller interface (AHCI) 151a for interfacing instruction data generated in the embedded processor 133, a direct memory access (DMA) unit 151b for interfacing writing data generated in the embedded processor 133, a serial-ATA (SATA) interface 151c for supporting an SATA interface between the advanced host controller interface 151a and the storage 201 and between the direct memory access unit 151b and the storage 201, a serial attached SCSI (SAS) interface 151d for supporting an SAS interface between the advanced host controller interface 151a and the storage 201 and between the direct memory access unit 151b and the storage 201, a PCI express (PCIe) interface 151e for supporting a PCIe interface between the advanced host controller interface 151a and the storage 201 and between the direct memory access unit 151b and the storage 201, and a multiplexer (MUX) 151f for selecting one of the SATA interface 151c, the SAS interface 151d, and the PCIe interface 151e according to an interface selection signal generated in the embedded processor 133 to connect the storage 201 and the embedded processor 133.

In the failure detection apparatus for a solid state drive tester according to the present invention, while a plurality of test devices for testing storages are one-chipped in one board through an FPGA, a user for testing an SSD connects the solid state drive tester to a storage to be tested, and then inputs a test condition through the host terminal 110. Here, the test condition may include an interface selection signal for interface with the storage to be tested, and a test pattern selection signal. The test pattern selection signal is a selection signal on whether predetermined set pattern data are to be selected or a plurality of random pattern data created arbitrarily is to be selected.

The test condition of the user input through the host terminal 110 is transferred to the test control unit 130 one-chipped through the network 120.

The communication interface unit 131 of the test control unit 130 receives the test condition input by the user through the network 120, and transfers the received test condition to the embedded processor 133. If the test condition is input by the user and a test is requested, the embedded processor extracts a test program for testing a storage from the memory 140 to start a test of the storage. Here, as an initial operation, test pattern data corresponding to the test condition input by the user from the memory 140 are extracted to be transferred to the test executing unit 170.

The test executing unit 170 is a unit where a part for actually performing a test from the embedded processor 133 is realized with a separate logic, and by separating the part (creation of test pattern data and confirmation of a failure) for performing the test from the embedded processor 133, a load of the embedded processor 133 can be reduced and a plurality of storages can be controlled and tested at the same time, making it possible to shorten an overall testing time.

In more detail, as illustrated in FIG. 3, the pattern data generator 171 of the test executing unit 170 selects one of pattern data created to corresponding to a test condition according to a pattern data selection signal output from the embedded processor 133 and arbitrarily created pattern data to generate pattern data.

For example, as illustrated in FIG. 4, in the pattern data generator 171, the pattern data memory 171a stores the pattern data created to correspond to the test condition and outputs the stored pattern data to the multiplexer 171c, and a pattern data creating unit 171b creates pattern data (pseudo random binary sequence: PRBS) at random to transfer the pattern data to the multiplexer 171c.

Here, preferably, the pattern data creating unit 171b includes a plurality of pattern data creators 171b-1 to 171b-4 for creating pattern data at random. For example, 8 bit pattern data are generated by the pattern data creator 171b-1, 16 bit pattern data are generated by the pattern data creator 171b-2, 24 bit pattern data are generated by the pattern data creator 171b-3, and 32 bit pattern data are generated by the pattern data creator 171b-4.

The multiplexer 171c selects one of the pattern data stored in the pattern data memory 171a and the pattern data created arbitrarily by the pattern data creating unit 171b according to a pattern data selection signal generated by the embedded processor 133 to transfer the selected data to the multi-interface 151 of the storage interface unit 132. Here, when a plurality of storages is tested at the same time, pattern data are applied to a plurality of multi-interfaces at the same time.

Then, as illustrated in FIG. 5, an interface selection signal is provided to the multi-interface 151 to select an interface corresponding to the storage 201.

For example, an interface selection signal is applied from the embedded processor 133 to the multiplexer 151f of the multi-interface 151, and the multiplexer 151f selects one of the interfaces (SATA, SAS, PCIe) according to the applied interface selection signal. That is, the multiplexer 151f selects an interface corresponding to the interface of the storage 201.

Thereafter, instruction data output for a test by the embedded processor 133 are input to the SATA interface 151c, the SAS interface 151d, and the PCIe interface 151e, respectively, through the instruction generator 178 and the advanced host controller interface 151a.

In addition, the writing data output from the test executing unit 170 are input to the SATA interface 151c, the SAS interface 151d, and the PCIe interface 151e, respectively, through the direct memory access (DMA) unit 151b.

If the instruction data output from the embedded processor 133 and the writing data output from the test executing unit 170 are input to the interfaces, respectively, the multiplexer 151f selects only one interface according to an interface selection signal. The instruction data and writing data input to the selected interface is transferred to the storage 201, and thus a test of the storage 201 is started. For example, when the interface of the storage 201 uses an SATA interface, the SATA interface 151c is selected, and the instruction data and writing data input to the SATA interface 151c are converted into a format suitable for the SATA interface and is applied to the storage 201.

Here, as the SATA interface, the SAS interface, and the PCIe interface employ a standard interface for interfacing, a detailed description of the interfaces will be omitted.

Next, result data for testing the storage 201 are read out according to a reading instruction, and then are transferred to the embedded processor 133 through the multiplexer 151f, the SATA interface 151c, and the DMA unit 151b of the multi-interface 151.

If the data obtained by reading out the storage test are transferred to the embedded process 133, the embedded processor 133 transmits the transferred readout data to the test executing unit 170.

The failure processor 176 of the test executing unit 170 determines a failure of a target to be tested through the configuration illustrated in FIG. 6, in which case according to the present invention, the readout data are continuously stored through the configuration of FIG. 3, and the failure processor 176 tests a test target in real time.

For example, the failure processor 176 generates a memory selection signal for selecting readout data, and the generated memory selection signal is transferred to the first buffer memory 173 while a phase thereof is inverted by the inverter 172 and is transferred to the second buffer memory 174 while a phase thereof is not inverted.

Thus, the first and second buffer memories 173 and 174 are operated in an opposite way, so the input readout data are stored in an interleaving manner. For example, when the first buffer memory 173 stores readout data, the second buffer memory 174 outputs the stored readout data to the multiplexer 175. On the other hand, when the second buffer memory 174 stores readout data, the first buffer memory 173 transfers the stored readout data to the multiplexer 175. Thus, a test of the storage is started, readout data of an arbitrary channel are always transferred to the multiplexer 175, and the readout data transferred to the memory selection signal generated by the failure processor 176 are selected to be transferred to the failure processor 176. For example, the memory selection signal transferred to the multiplexer 175 becomes a selection signal for selecting a memory actually outputting readout data from the first buffer memory 173 and the second buffer memory 174.

As described above, if the readout data are stored in an interleaving manner by using a plurality of buffer memories, as readout data of an arbitrary channel are always transferred to the failure processor 176 in real time as the test is started, a problem of having to stop comparison when the readout data are stored in the buffer memory according to the related art can be solved.

The comparator 176a of the failure processor 176 compares expectation data (pattern data) output from the pattern data generator 171 with readout data (reading data) transferred from the embedded processor 133, and if the same, the data are not output, and if the expectation data and the readout data are different from each other, a failure signal is generated.

In response to the generated failure signal, the failure counter 176b increases an internal count value by one and outputs the failure count value, and the failure memory address generator 176c generates an address of the failure memory to transfer the address to the failure memory 177.

The failure memory 177 stores the expectation data and readout data input to the failure processor 176 as failure information while taking the transferred address as a logical block address (LBA).

Another feature of the present invention is that during a test of a storage, a failure is not processed in the embedded processor 133 but is processed by using the test executing unit 170 separated from the embedded processor 133 with a separate logic and a plurality of pattern data are created and failures of a plurality of storages are confirmed at the same time if necessary, whereby a burden of the embedded processor 133 can be mitigated and a storage testing time can be shortened by testing the storages at the same time.

In addition, the failure information stored in the failure memory 177 is transferred to the embedded processor 133 according to a request of the embedded processor 133 after the test is ended, and is transmitted to the host terminal 110 through the communication interface 131 and the network 120.

Thus, a user can easily confirm a test result of the tested storage through the host terminal 110.

As described above, the present invention can separate an SSD test function performed by an embedded processor with a separate logic, thereby reducing a load of the embedded processor and accordingly shortening an entire SSD testing time.

In addition, the present invention can include a plurality of buffer memories so that readout data are continuously stored in the buffer memories in an interleaving manner, thereby solving a problem of stopping comparison when the readout data are stored and continuously testing a test target in real time, and accordingly, shortening a testing time of the test object.

The present invention is not limited to the above-described embodiment, and may be variously modified by those skilled in the art to which the present invention pertains without departing from the spirit of the present invention and the modification falls within the scope of the present invention.

What is claimed is:

1. A failure detection apparatus for a solid state driver tester, the failure detection apparatus comprising:
   a host terminal for receiving a test condition for testing a storage from a user; and
   a test control unit for creating a first pattern data either according to the test condition or at random, and adaptively selecting an interface according to a type of the storage to be tested to test the storage with the first pattern data, the test control unit comprising a test executing unit configured:
   to create the first pattern data for the storage in association with an embedded processor to transmit the first pattern data to the storage;

to read out the first pattern data stored in the storage; and
to compare a readout pattern data with the first pattern data in real time to determine whether there is a failure, the test executing unit comprising:
  a pattern data generator selecting the first pattern data either corresponding to the test condition or at random according to a pattern data selection signal output from the embedded processor to generate the first pattern data; and
  an inverter for inverting a phase of a memory selection signal for storing the readout pattern data read out from the storage in an interleaving manner.

2. The failure detection apparatus of claim 1, wherein the test control unit further includes:
  a communication interface unit connected to the host terminal through a network to receive information of the user and transmit a test result to the host terminal; and
  a storage interface unit for interfacing the storage.

3. The failure detection apparatus of claim 2, wherein the storage interface unit includes a plurality of multi-interfaces for testing a plurality of storages at the same time, and the multi-interface includes a plurality of interfaces to correspond to the interface of the storage, and selects one of the interfaces according to an interface selection signal generated to correspond to the storage interface by the embedded processor to interface with the storage.

4. The failure detection apparatus of claim 1, wherein the test executing unit includes:
  a first buffer memory for storing the readout pattern data read out from the storage according to the inverted phase of the memory selection signal output by the inverter;
  a second buffer memory for storing the readout pattern data read out from the storage according to the memory selection signal;
  a multiplexer for selecting one of the readout pattern data output from the first and second memories according to the memory selection signal;
  a failure processor for comparing the first pattern data generated by the pattern data generator with the selected readout pattern data output from the multiplexer to determine a failure, generating failure information in a case of a failure, and generating the memory selection signal;
  a failure memory for storing the failure information generated by the failure processor; and
  an instruction generator for transmitting a test instruction generated by the embedded processor to a storage interface unit.

5. The failure detection apparatus of claim 4, wherein the pattern data generator includes:
  a pattern data memory for storing the first pattern data created according to the test condition;
  a pattern data creating unit for creating the first pattern data at random; and
  a multiplexer for selecting the first pattern data either from the pattern data memory or from the pattern data creating unit according to the pattern data selection signal output from the embedded processor to output the first pattern data.

6. The failure detection apparatus of claim 5, wherein the pattern data creating unit includes a plurality of pattern data creators for creating the first pattern data at random.

7. The failure detection apparatus of claim 4, wherein the failure processor includes:
  a comparator for comparing writing data generated by the pattern data generator with reading data read out from the storage, and generating a failure signal when the writing data and the readout data are not the same;
  a failure counter for counting the number of failure signals generated by the comparator, and outputting a failure count value; and
  a failure memory address generator for generating a storage address for storing the failure signal when the failure signal is generated by the comparator.

8. A failure detection apparatus for a solid state driver tester, the failure detection apparatus comprising:
  a host terminal for receiving a test condition for testing a storage from a user; and
  a test control unit for generating a first pattern data either according to the test condition or at random, and adaptively selecting an interface according to a type of the storage, the test control unit comprising a test executing unit configured to generate and transmit the first pattern data to the storage and to compare a readout pattern data of the first pattern data stored in the storage with the first pattern data in real time to determine whether there is a failure, the test executing unit comprising:
  a pattern data generator selecting the first pattern data either corresponding to the test condition or at random according to a pattern data selection signal;
  an inverter configured to invert a phase of a memory selection signal for storing the readout pattern data read out from the storage;
  a plurality of buffer memories for storing the readout pattern data of the first pattern data stored in the storage, wherein at least one of the plurality of buffer memories is coupled to the inverter; and
  a multiplexer coupled to the plurality of buffer memories and configured to select one of the readout pattern data output from the plurality of buffer memories according to the memory selection signal in an interleaving manner.

* * * * *